(12) United States Patent
Munden et al.

(10) Patent No.: US 6,545,896 B1
(45) Date of Patent: Apr. 8, 2003

(54) STORAGE PACK FOR USE IN HIGH PERFORMANCE SYSTEMS

(75) Inventors: Terrel R. Munden, Boise, ID (US); Sarah M. Brandenberger, Boise, ID (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/062,469

(22) Filed: Feb. 5, 2002

(51) Int. Cl.⁷ .................................................. G11C 7/02

(52) U.S. Cl. .............................. 365/53; 365/173; 365/52

(58) Field of Search ........................... 365/53, 173, 52; 361/684, 687, 676, 679

(56) References Cited

U.S. PATENT DOCUMENTS

| | | | | |
|---|---|---|---|---|
| 4,691,350 A | * | 9/1987 | Kleijne et al. ................. 380/52 |
| 4,985,804 A | * | 1/1991 | Campbell et al. ........... 165/80.3 |
| 5,724,654 A | * | 3/1998 | Yamada et al. ............. 340/7.63 |
| 5,785,186 A | * | 7/1998 | Babbs et al. ................. 206/454 |

* cited by examiner

*Primary Examiner*—Richard Elms
*Assistant Examiner*—Anh Phung

(57) ABSTRACT

A memory housing is provided comprising at least one memory device positioned within the housing, the at least one memory device having a performance parameter responsive to an environmental condition, and an environmental maintaining device for non-ambiently changing an environmental condition within the memory housing to cause the performance parameter of the at least one memory device to meet a criteria.

30 Claims, 3 Drawing Sheets

STORAGE PACK FOR USE IN HIGH PERFORMANCE SYSTEMS

BACKGROUND OF THE INVENTION

1. Field of the Invention

The invention relates generally to a memory housing, more particularly, to a magnetic random access memory (MRAM) housing comprising an environmental maintaining device for non-ambiently changing an environmental condition within the memory housing.

2. Background of the Invention

It is widely known that conventional electronic devices employ a variety of memory devices for temporary and long term data storage. Some memory devices, such as dynamic random access memory (DRAM), store data electrically, and require continual refreshing in order to properly hold data. MRAM, an emerging technology, is a memory device that stores information magnetically, rather than electrically. Unlike electrical data storage, MRAM memories can store data over long periods of time without refreshing, similar to present flash memory. Furthermore, MRAM memories can be operated at higher speeds than conventional electrical data storage memories, thereby improving the performance of MRAM read and write access over conventional electrical data storage devices.

IBM has been developing MRAM devices since 1974, and jointly with Infineon Corp. in recent months. One such experimental IBM/Infineon MRAM chip is described in IBM's Research News Press Release of Dec. 7, 2000 entitled "IBM Magnetic RAM (MRAM) Images" which is incorporated by reference herein in its entirety.

MRAM devices, however, typically suffer from problems due to sensitivity to environmental conditions such as ambient magnetic fields and temperature. Thus, the performance characteristics of a particular MRAM device vary considerably depending on the current environment the MRAM is placed it, which hinders implementation of MRAM technology. Hence, a need exists for isolating MRAM devices from environmental conditions.

SUMMARY OF THE INVENTION

The present invention is directed to overcoming or at least reducing the effects of one or more of the problems set forth above and other problems in the prior art.

According to one aspect of the present invention, a memory housing is provided comprising at least one memory device positioned within the housing, the at least one memory device having a performance parameter responsive to an environmental condition, and an environmental maintaining device for non-ambiently changing an environmental condition within the memory housing to cause the performance parameter of the at least one memory device to meet a criteria.

According to another aspect of the present invention, the environmental maintaining device comprises at least one temperature maintaining device for changing the temperature within the housing, the temperature causing the performance parameter of the at least one memory device to meet a criteria.

According to another aspect of the present invention, the at least one temperature maintaining device includes at least one peltier.

According to another aspect of the present invention, the at least one environmental maintaining device comprises a magnetic field source for generating a magnetic field within the housing, the magnetic field source being configured to establish an operating magnetic field within the housing thereby causing the performance parameter of the at least one memory device to meet a criteria.

According to another aspect of the present invention, the criteria is a separation between two logic levels greater than a predetermined level.

According to another aspect of the present invention, the criteria is the rate of failed memory reads or writes.

According to another aspect of the present invention, the memory device further comprises a shield for isolating the at least one memory device from external electro-magnetic fields.

According to another aspect of the present invention, the at least one memory device comprises at least one mram.

According to yet another aspect of the present invention, a method of storing data with a memory device is provided comprising the steps of: obtaining at least one memory device having a performance parameter responsive to an environmental condition, the at least one memory device being positioned within a housing, and non-ambiently regulating at least one environmental condition within the housing to cause a performance parameter of the at least one memory device to meet a criteria.

According to another aspect of the present invention, the method further comprises the step of shielding the housing from external electro-magnetic fields.

BRIEF DESCRIPTION OF THE DRAWINGS

The foregoing advantages and features of the invention will become apparent upon reference to the following detailed description and the accompanying drawings, of which.

DETAILED DESCRIPTION OF THE PREFERRED EMBODIMENTS

Reference will now be made in detail to presently preferred embodiments of the invention. Wherever possible, the same reference numbers will be used throughout the drawings to refer to the same or like parts.

The following description of the present invention will describe implementations of the present invention using MRAM devices as exemplary memory devices. It should appreciated, however, that the term "memory device" is not limited to MRAM devices, and should be broadly interpreted to include other memory devices such as DRAM devices, RDRAM devices, SDRAM devices, flash memory devices, data registers, and other memory devices as would be readily apparent to one skilled in the art. Furthermore, the term "environmental condition" will be described in reference to conditions such as temperature, ambient magnetic fields, humidity, and ambient pressure, but should be broadly interpreted to include other environmental conditions as would be readily apparent to one skilled in the art.

As referenced throughout the specification, the term "criteria" is intended to include performance criteria, such as the separation in electric potential between two logic levels (e.g., a "low" logic level 0 and a "high" logic level 1) or the rate of failed memory reads and/or writes (e.g., bit error rate). However, the term "criteria" should be broadly interpreted to include criteria such as bipolar effects, ringing, and other criteria as would be readily apparent to one skilled in the art.

Figure 1:
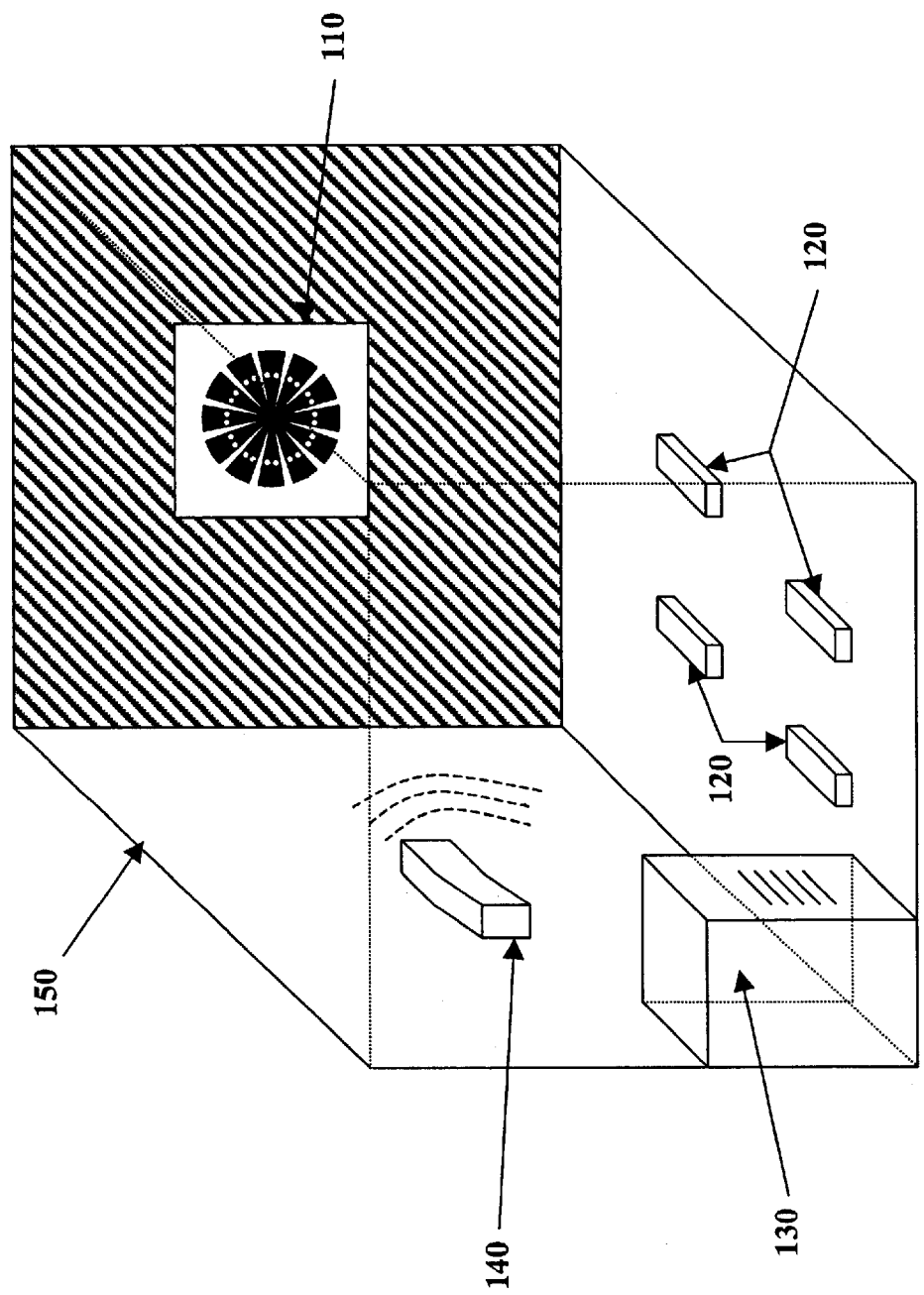
FIG. 1 is a block diagram of a first embodiment of a memory housing according to the present invention.

A memory housing 150 according to one embodiment of the present invention is shown in the perspective view of FIG. 1. The memory housing 150 includes a plurality of MRAM chips 120 positioned within the memory housing 150. The plurality of MRAM chips 120 have at least one performance parameter responsive to an environmental condition, such as temperature and/or ambient magnetic fields. As is readily apparent to one skilled in the art, the particular arrangement of the MRAM chips 120 within the memory housing 150 will vary by implementation, thus the arrangement as shown in FIG. 1 is not intended to be limiting on the scope of the invention.

At least one temperature maintaining device 130 may be provided for non-ambiently changing a temperature (e.g., an environmental condition) within the memory housing 150 to cause a performance parameter of the plurality of MRAM chips 120 to meet a criteria. A peltier, for example, a heating/cooling device using peltier technology manufactured by Melcor of Trenton, N.J., is one such suitable temperature maintaining device 130.

In general, MRAM performance is related to the temperature of the MRAM, as MRAM performance is inversely related to the coercivity of a particular MRAM which is dependent on temperature. The effects of temperature in coercivities for magnetic particles is described in Finn Jorgensen, *The Complete Handbook of Magnetic Recording* ($4^{th}$ ed. 1996), which is incorporated by reference herein in its entirety. The inventors have discovered that adjusting the temperature surrounding the MRAM chips can thus lead to improved MRAM performance (e.g., shorter writing times, higher data rates, etc.) over conventional designs.

It should be appreciated that the temperature maintaining device 130 preferably can maintain a temperature within the memory housing 150 without substantial dependence on outside (i.e., ambient) temperature. Thus, the memory housing 150 can be moved to a substantially warm environment or a substantially cold environment without requiring additional equipment to maintain the temperature within the memory housing 150, unlike a conventional fan-based cooling system. Optionally, a fan 110 may be provided in addition to the temperature maintaining device 130 to further provide for environmental control if the ambient temperature does not vary considerably.

In general, MRAM performance is also directly related to the magnetic flux density surrounding a particular MRAM, because magnetic flux density is directly proportional to the electrical conductivity of a given device. This relationship can be characterized by a magnetization field (H) to magnetic flux density (B) curve (a.k.a., a BH/hysteresis curve) for a given MRAM, which varies by implementation. An exemplary explanation of BH curve analysis is described, for example in Richard P. Feynman, *The Feynman Lectures on Physics Vol.*2 (1964) which is incorporated by reference herein in its entirety. A magnetic field source 140 may be provided for generating a magnetic field (e.g., an environmental condition) within the memory housing 150. The generated magnetic field is configured to establish an operating magnetic field within the memory housing 150, thereby causing a performance parameter of the plurality of MRAM chips 120 to meet a criteria.

Figure 2:
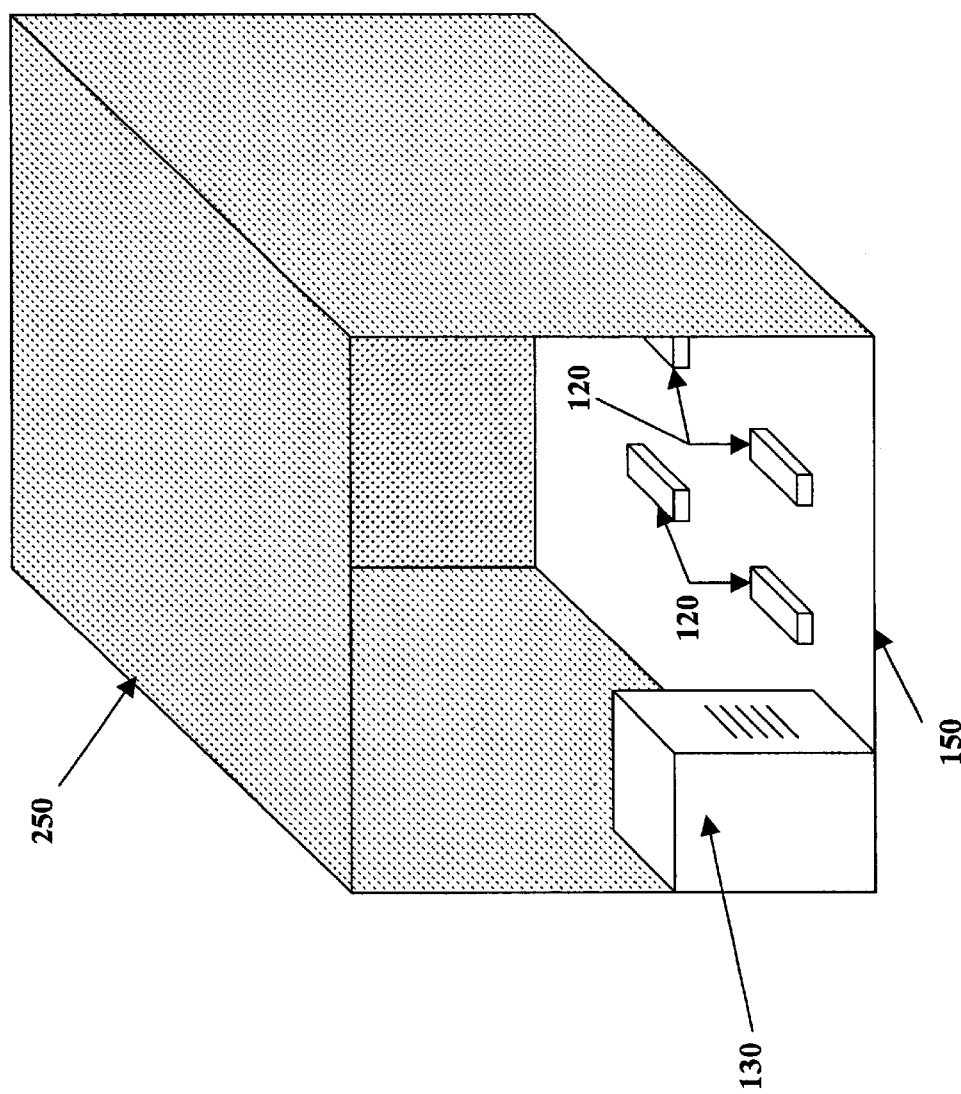
FIG. 2 is a block diagram of a shielded memory housing according to an embodiment of the present invention.

As shown in FIG. 2, a shield 250 may be provided around the memory housing 150 for isolating the plurality of MRAM chips 120 from electro-magnetic fields external to the memory housing 150. For purposes of explanation only, the shield 250 has been omitted on the front and bottom surfaces of the memory housing 150. The shield 250 may partially, or completely surround the memory housing 150, or may be omitted altogether depending on the particular implementation. By isolating the MRAM chips 120 from external electromagnetic fields, the magnetic field within the memory housing 150 can be more accurately controlled and is subject to less variation, thereby providing more consistent MRAM performance over conventional systems.

Figure 3:
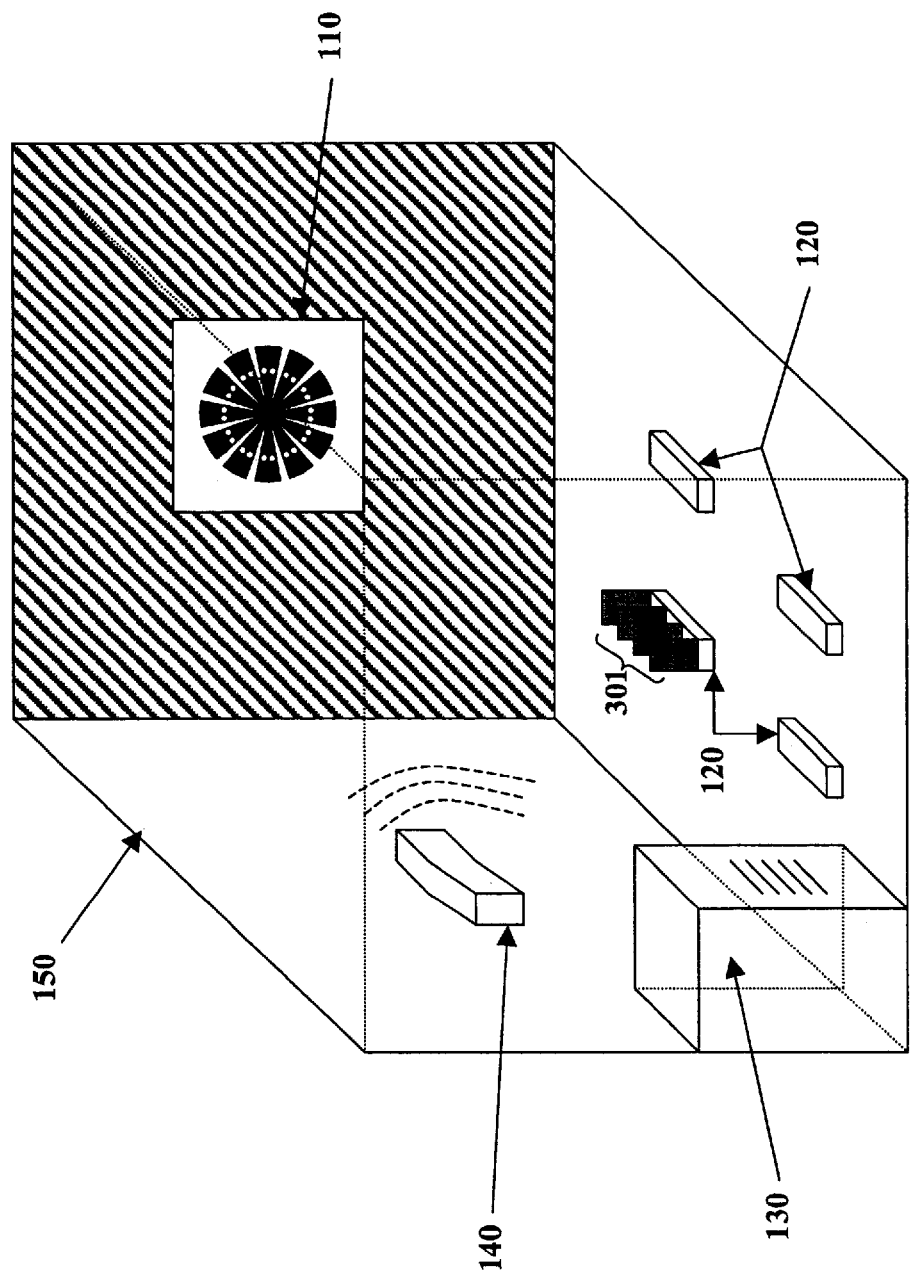
FIG. 3 is a block diagram of a memory housing having an MRAM with a heat sink according to an embodiment of the present invention.

As shown in FIG. 3, a plurality of heat sinks 301 can be positioned adjacent to the MRAM chips 120 to facilitate improved heat transfer from the MRAM chips within the memory housing 150. For purposes of explanation only, the heat sinks 301 are shown in FIG. 3 on only one MRAM 120. However, heat sinks 301 can be provided on all or some of the MRAM chips 120 as would be readily apparent to one skilled in the art.

A memory housing according to the present invention thus provides for improved MRAM performance by non-ambiently changing an environmental condition (e.g., magnetic field, temperature, etc.) within the memory housing to cause a performance parameter of at least one MRAM to meet a criteria.

Thus, a memory housing comprising at least one memory device and at least one environmental maintaining device has been described according to the present invention. Many modifications and variations may be made to the techniques and structures described and illustrated herein without departing from the spirit and scope of the invention. Accordingly, it should be understood that the methods and apparatus described herein are illustrative only and are not limiting upon the scope of the invention.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined the claims appended hereto, and their equivalents.

What is claimed is:

1. A memory housing comprising:
   at least one memory device positioned within said housing, said at least one memory device having a performance parameter responsive to an environmental condition; and
   an environmental maintaining device for non-ambiently changing an environmental condition within said memory housing to cause said performance parameter of said at least one memory device to meet a criteria.

2. The memory housing of claim 1, wherein the environmental maintaining device comprises at least one temperature maintaining device for changing the temperature within said housing, said temperature causing said performance parameter of said at least one memory device to meet a criteria.

3. The memory housing of claim 2, wherein the at least one temperature maintaining device includes at least one peltier.

4. The memory housing of claim 2, wherein the environmental maintaining device further comprises at least one fan.

5. The memory housing of claim 2, wherein the environmental maintaining device further comprises at least one heat sink positioned adjacent to said at least one memory device.

6. The memory housing of claim 1, wherein the at least one environmental maintaining device comprises a magnetic field source for generating a magnetic field within said housing, said magnetic field source being configured to establish an operating magnetic field within said housing thereby causing said performance parameter of said at least one memory device to meet a criteria.

7. The memory housing of claim 1, wherein the criteria is a separation between two logic levels greater than a predetermined level.

8. The memory housing of claim 1, wherein the criteria is the rate of failed memory reads or writes.

9. The memory housing of claim 1, further comprising: a shield for isolating said at least one memory device from external electromagnetic fields.

10. The memory housing of claim 1, wherein the at least one memory device comprises at least one mram.

11. A method of storing data with a memory device comprising the steps of:
    obtaining at least one memory device having a performance parameter responsive to an environmental condition, said at least one memory device being positioned within a housing; and
    non-ambiently regulating at least one environmental condition within said housing to cause a performance parameter of said at least one memory device to meet a criteria.

12. The method of claim 11, wherein the at least one environmental condition is the temperature within said housing.

13. The method of claim 12, wherein the step of regulating at least one environmental condition is performed by at least one peltier.

14. The method of claim 11, wherein the at least one environmental condition is the magnitude of a magnetic field within said housing.

15. The method of claim 14, wherein the step of regulating at least one environmental condition is performed by a magnetic field source.

16. The method of claim 11, wherein the criteria is a separation between two logic levels greater than a predetermined level.

17. The method of claim 11, wherein the criteria is the rate of failed memory reads or writes.

18. The method of claim 11, further comprising the step of: shielding said housing from external electromagnetic fields.

19. The method of claim 11, wherein the at least one memory device comprises at least one mram.

20. An mram memory comprising:
    a housing;
    a plurality of mrams positioned within said housing;
    a temperature control device for establishing a temperature within said housing corresponding to an operating parameter of said plurality of mrams; and
    a magnetic field source for establishing a magnetic field within said housing corresponding to an operating parameter of said plurality of mrams,
    wherein the temperature and magnetic field within said housing are established to cause an operating parameter of said plurality of mrams to meet a criteria.

21. The memory of claim 20, wherein the criteria is a separation between two logic levels greater than a predetermined level.

22. The memory of claim 20, wherein the criteria is the rate of failed memory reads or writes.

23. The memory of claim 20, further comprising: a shield for isolating said plurality of mrams from external electromagnetic fields.

24. The memory of claim 20, wherein the temperature control device comprises at least one peltier.

25. The memory of claim 22, further comprising at least one fan.

26. A method of storing data with a plurality of mrams, comprising the steps of:
    obtaining a plurality of mrams positioned within a housing;
    establishing a temperature within said housing corresponding to an operating parameter of said plurality of mrams; and
    establishing a magnetic field within said housing corresponding to an operating parameter of said plurality of mrams,
    wherein the temperature and magnetic field within said housing are established to cause an operating parameter of said plurality of mrams to meet a criteria.

27. The method of claim 26, wherein the criteria is a separation between two logic levels greater than a predetermined level.

28. The method of claim 26, wherein the criteria is the rate of failed memory reads or writes.

29. The method of claim 26, further comprising the step of: shielding said plurality of mrams from external electromagnetic fields.

30. The method of claim 26, wherein the step of establishing a temperature within said housing is performed by at least one peltier.

* * * * *